United States Patent [19]

Lin

[11] Patent Number: 5,742,083
[45] Date of Patent: Apr. 21, 1998

[54] ELECTROSTATIC DISCHARGE PROTECTION METAL-OXIDE SEMICONDUCTOR FIELD-EFFECT TRANSISTOR WITH SEGMENTED DIFFUSION REGIONS

[75] Inventor: Shi-Tron Lin, Taipei, Taiwan

[73] Assignee: Winbond Electronics Corporation, Taiwan

[21] Appl. No.: 778,742

[22] Filed: Jan. 2, 1997

[30] Foreign Application Priority Data

Aug. 14, 1996 [TW] Taiwan ................................ 85109874

[51] Int. Cl.⁶ .................................................. H01L 23/62
[52] U.S. Cl. ........................... 257/355; 257/360; 257/647
[58] Field of Search ..................................... 257/355, 360, 257/356, 271, 647

[56] References Cited

U.S. PATENT DOCUMENTS 4,962,410 10/1990 Kriman et al. ............................ 257/192
5,105,243 4/1992 Nakagawa et al. ....................... 257/212
5,157,573 10/1992 Lee et al. ................................. 257/355

FOREIGN PATENT DOCUMENTS 2-214165 8/1990 Japan ....................................... 257/355

*Primary Examiner*—Tom Thomas
*Assistant Examiner*—David B. Hardy
*Attorney, Agent, or Firm*—Rabin, Champagne, & Lynt, P.C.

[57] ABSTRACT

A MOSFET structure for an ESD protection circuit in a semiconductor IC device having segmented diffusion regions. The transistor includes a gate having an extended strip-shaped structure formed on the substrate of the IC device. A well region is formed in the substrate on a first side of the gate structure. A first drain diffusion region is formed in the well region, and a second drain diffusion region is formed partially inside the well region. A source diffusion region is formed in the substrate along a second side of the gate structure, opposing the first side. A field oxide layer is formed over the surface of the substrate, the field oxide layer comprises a number of finger-shaped extensions originating from the drain side of the transistor and extending into the source side of the transistor. The finger-shaped extensions divide the second drain diffusion region into a number of parallel-aligned segmented diffusion regions.

12 Claims, 4 Drawing Sheets

ELECTROSTATIC DISCHARGE PROTECTION METAL-OXIDE SEMICONDUCTOR FIELD-EFFECT TRANSISTOR WITH SEGMENTED DIFFUSION REGIONS

BACKGROUND OF THE INVENTION

1. Field of the Invention

The invention relates in general to an apparatus for protection against electrostatic discharge (ESD). In particular, the invention relates to a transistor structure for protection of semiconductor integrated circuit (IC) devices against ESD discharge. More particularly, the invention relates to a transistor structure for protection of IC devices against ESD discharge, having metal-oxide semiconductor field-effect transistors (MOSFET) with partially segmented diffusion regions.

2. Technical Background

N-type MOSFETs, herein referred to as NMOS FETs, either fabricated in gate-grounded or gate-coupled configuration, have been widely utilized as the primary component of ESD protection circuits in semiconductor IC devices. NMOS FETs used as the key protection elements of ESD protection circuits provide ESD-sustaining capability through a phenomenon known as a high-voltage snap-back mechanism. This snap-back mechanism provides for the safe conduction of the enormous electric current arising from an ESD event between the transistor drain and source regions. In the beginning stages of an ESD event, a high electric field intensity is established across the transistor drain junction, resulting in an impact ionization phenomenon which produces both minority and majority carriers. The minority carriers are responsible for a local electric potential established in the p-well region, as they flow toward a $V_{ss}$ connected p⁺ contact. When the electric potential accumulated in this region becomes higher than that of the proximate n⁺ source region by about 0.6 V, the source junction becomes forward biased. This forward-biased source junction then injects the minority carriers farther into the p-well. As the injected minority carriers further increase the effect of impact ionization, the NMOS FET eventually enters a low-resistance (snap-back) status, and the excessive ESD current is then released.

As the current flowing from the drain to the source increases, current constriction eventually arises, forcing the ESD current to travel along several narrow passages between the drain and the source junction, flowing through the weakest spots beneath the transistor gate. High current density flowing along the narrowed and constricted discharge passages inevitably leads to excessive heating, and more carriers are produced as a result. Regions in the device where the temperature rises above the melting point of silicon or aluminum would then suffer permanent damage, particularly in the silicon substrate or at the contacts. Discharge current arising from an ESD event that flows uniformly from transistor drain region to source region and which spreads along the entire gate edge is the current pattern that provides the best ESD protection. If there is any weak spot—a non-uniformity in the oxide spacer, for example—present along the gate edge, breakdowns would result first in the drain diffusion region proximate to that weak spot. Current constriction would arise in the region of the weak spot, resulting in permanent damage of the device experiencing the ESD current.

In order to uniformly distribute the ESD current, Alan Lee et al. proposed a transistor layout in U.S. Pat. No. 5,157,573, entitled "ESD Protection Circuit With Segmented Buffer Transistor." That particular layout is depicted in FIGS. 1 and 2 of the accompanying drawing of the invention in which FIG. 1 shows the schematic top view and FIG. 2 shows the cross-sectional schematic view of the ESD protection circuit.

As shown in the drawing, and in particular in the cross-sectional view of FIG. 2, the source diffusion region 12 of the MOS protection transistor 10 is formed in a p-well 15, while the drain diffusion region 11 is formed in both the p-well 15 and an n-well 16. As shown in the top view of FIG. 1, the drain diffusion region 11 of the MOS transistor 10 includes a number of aligned, parallel-arranged, and segmented diffusion regions 11a, 11b, 11c, and 11d. In a similar manner, the source diffusion region 12 also includes segmented diffusion regions 12a, 12b, 12c and 12d. Each of the segmented diffusion regions 12a–12d has at least one contact opening on the source side of the transistor device. In the drawing, each one of the contact openings 13a–13d is shown as having a corresponding source segmented diffusion region 12a–12d.

Essentially, the ESD protection MOS transistor 10 generally identified in the cross-sectional view of FIG. 2 may be considered to be segmented into a number of parallel-arranged smaller segmented transistors 10a, 10b, 10c and 10d, as shown in the top view of FIG. 1. Each of the MOS segments 10a–10d thus is a complete transistor with a drain diffusion region 11a–11d and a source diffusion region 12a–12d. Gates thereof, however, are integrated as one single gate structure 14. In an ESD event, discharge current originating at the IC device bonding pad connected to the system power supply ($V_{DD}$) bus or input/output port, generally indicated as 18, flows through the drain diffusion region 17 and the n-well 16 and into the drain diffusion region 11. This discharge current flow path can be better seen in the cross-sectional view of FIG. 2. Since, as clearly shown in the top view of FIG. 1, the MOS transistor 10, as the key ESD protection element, is divided into segments, the smaller, aligned MOS transistors 10a–10d, discharge current would thus be evenly distributed into the segmented drain diffusion regions 11a–11d, and subsequently into the segmented source diffusion regions 12a–12d. At the source diffusion region 12 divided into segmented source diffusion regions 12a–12d, the discharge current can then be released into the system ground potential plane at the ground bus ($V_{SS}$) via contacts in openings 13a–13d. Although the ESD current discharge path is evenly distributed among the segmented transistors 10a–10d, this circuit design, however, still suffers the following drawbacks.

First, the width of each segmented MOS transistor is limited. As shown in the top view of FIG. 1, distances between each contact opening (13a–13d) and the edges of its corresponding diffusion region in all four directions, for example, distances identified as $d_1$, $d_2$, $d_3$, and $d_4$, are constrained. The width of each of the segmented MOS transistors 10a–10d cannot be made as small as needed to optimize the ESD performance. As a result, this width constraint places a limitation on the electric potential field strength the MOS transistor 10 can sustain in an ESD event.

Secondly, contact openings in the source side of the protection MOS transistor are limited in number. Predetermined minimum distances from the contact opening edges to the edges of the diffusion region as well as to the edges of the polysilicon layer must be maintained. For example, distances $d_1$, $d_2$, $d_3$, and $d_4$ in FIG. 1 must not be less than a prescribed minimum value. These safe minimum distances are required in order to prevent damage to the contacts in case of an ESD event, in which excessive current flows through. Since the entire diffusion region on the source side of the MOS transistor 10 is segmented into a number of smaller regions, the total number of contacts provided for the transistor 10 is necessarily fewer than can be arranged on a larger integrated source diffusion region. Provision of fewer contacts means there would be a larger discharge current density per contact during an ESD event. This is a hindrance to making a better MOS transistor device for protecting an IC from ESD damage.

SUMMARY OF THE INVENTION

It is therefore an object of the invention to provide an ESD protection MOSFET having segmented diffusion regions that provides effective ESD protection by evenly distributing discharge current arising in an ESD event.

It is another object of the invention to provide an ESD protection MOSFET having segmented diffusion regions that provides effective ESD protection by preventing overheating that leads to permanent damage in weak spots in an IC.

The invention achieves the above-identified objects by providing a MOSFET structure for ESD protection of semiconductor IC devices. The structure has segmented diffusion regions. The transistor includes a gate having an extended strip-shaped structure formed on the substrate of the IC device. A well region is formed in the substrate on the first side of the gate. A first drain diffusion region is formed in the well region, and a second drain diffusion region is formed partially inside the well region. A source diffusion region is formed in the substrate on the second side of the gate, opposing the first side. A field oxide layer is formed over the surface of the substrate, the field oxide layer including a number of finger-shaped extensions originating on the drain side of the transistor and extending to the source side of the transistor. The finger-shaped extensions divide the second drain diffusion region into a number of parallel-aligned segmented diffusion regions.

Alternatively, the drain diffusion region may be a single integrated region formed in the substrate. The field oxide layer may comprise parallel-aligned islands dividing the drain diffusion layer.

BRIEF DESCRIPTION OF THE DRAWING

Other objects, features, and advantages of the invention will become apparent by way of the following detailed description of the preferred but non-limiting embodiments. The description is made with reference to the accompanying drawings in which.

DETAILED DESCRIPTION OF THE PREFERRED EMBODIMENT

Figure 1:
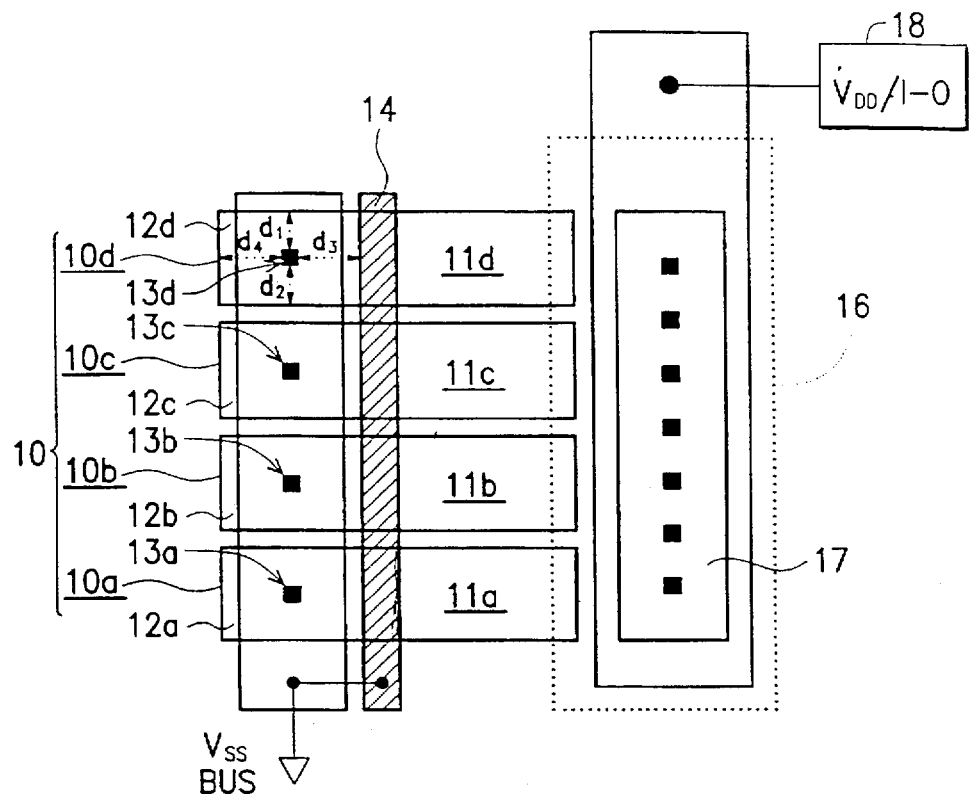
FIG. 1 schematically shows the top view of the layout of a conventional ESD protection circuit.
Figure 2:
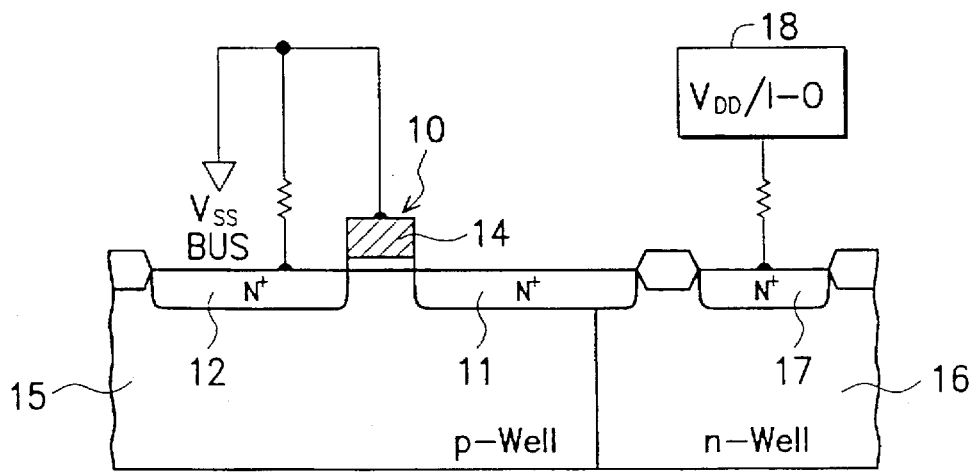
FIG. 2 schematically shows a cross-sectional view of the conventional ESD protection circuit of FIG. 1.
Figure 3:
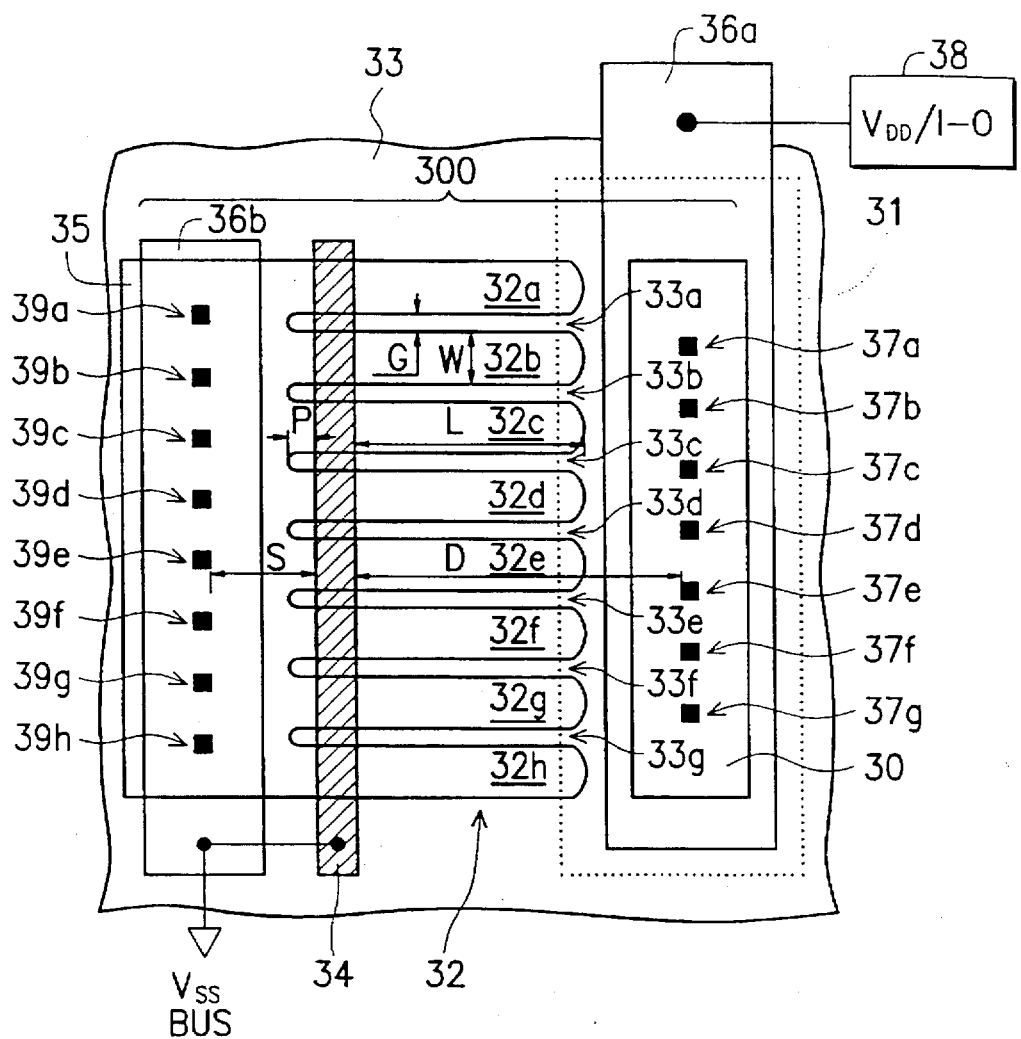
FIG. 3 schematically shows a top view of a layout of an ESD protection circuit in accordance with the first embodiment of the invention.

FIG. 3 schematically shows a top view of a layout of an ESD protection circuit in accordance with a first embodiment of the invention. For the MOS transistor used as the key element for protection against ESD damage, a first $n^+$ drain diffusion region 30 thereof is formed in an n-well 31. The generally identified second $n^+$ drain diffusion region 32 is formed in the silicon substrate, as well as partially inside the n-well 31. The field oxide layer 33 is configured such that it has at least one, preferably several, finger-shaped extensions, such as those identified as 33a–33g. All the extensions are arranged in parallel with aligned respective longitudinal axes. Each finger 33a–33g extends from the drain side into the source side of the MOS transistor device. They pass over the entire second $n^+$ drain diffusion region 32, continue over the entire gate strip 34, and then extend partially into the $n^+$ source diffusion region 35. As a result, the second $n^+$ drain diffusion region 32 is segmented into a number of smaller diffusion regions 32a–32h. Meanwhile, the source diffusion region 35 remains a single region without segmentation. Each of the field oxide extensions 33a–33g has a diffusion region segment at either side. For example, field oxide extension 33d has drain diffusion regions 32d and 32e on either side. These segmented diffusion regions 32a–32h thus constitute parallel passages in the entire diffusion region 32.

The first $n^+$ drain diffusion region 30 of the ESD protection MOS transistor is electrically connected to an input/output terminal or the $V_{DD}$ power supply bus of the IC device being protected against ESD damage, at the bonding pad 38 through connection with the metallization 36a via the multiple contact openings 37a–37g in the first $n^+$ drain diffusion region 30. Meanwhile, on the other end, the $n^+$ source diffusion region 35 of the MOS transistor is electrically connected to the $V_{SS}$ ground potential plane of the IC device through the metallization 36b via the multiple contact openings 39a–39h in the source diffusion region 35. In this first embodiment of the invention, each of the segmented diffusion regions 32a–32h in the transistor drain region 32 partially overlaps the n-well 31 in the vertical direction. As a result, the n-well 31 provides a portion of the resistive path for the discharge current arising in an ESD event. In essence, the n-well 31 constitutes a section of the discharge current path starting from the bonding pad 38, going along the first $n^+$ drain diffusion region 30, and subsequently into the segmented diffusion regions 32a–32h. This significantly helps to distribute heat generated in an ESD event as a result of the flow of discharge current along the current path. Of course, materials of a resistive nature other than the n-well 31 may be used between the first $n^+$ drain diffusion region 30 and the segmented diffusion regions 32a–32h, as persons skilled in this art will appreciate.

In this first embodiment, the second n+ drain diffusion region 32 is completely segmented into a multiple number of smaller parallel-aligned diffusion regions 32a–32h. This substantially segments the MOS transistor device, generally designated as MOS protection transistor 300, into a number, eight in the exemplary embodiment, of smaller, aligned MOS protection transistors. Each of these smaller ESD protection MOS transistors has a drain resistor including a corresponding portion of the series-connected n-well 31. When ESD current flows into any of these segmented MOS transistors, the series drain resistance increases the drain voltage in the corresponding area, thereby forcing the ESD current to also flow into the other small MOS transistors, which are effectively connected in parallel. The direct result of this phenomenon is the even distribution of the ESD discharge current, which significantly enhances the robustness of the entire MOS transistor 300 used as the key protection element. Further, since all the drain resistors are arranged in parallel, the effective total drain resistance is much smaller than that of each of the constituent segmented regions. The effective drain resistance therefore does not affect the normal effectiveness of the NMOS protection transistor 300.

Thus, based on the above description of the first embodiment of the invention, it is clear that the drawbacks of the previously-discussed conventional MOS protection transistor are resolved by the MOS transistor design of the invention. Specifically, advantages provided by the transistor design of the invention can be summarized as follows.

First, since the overall MOS transistor 300 is substantially segmented into a number of smaller transistors, the width of each constituent transistor thus is not constrained by the spacing between the edges of the contact opening and the edges of the proximate diffusion region. Each of the constituent small transistors may therefore have a width that can be reduced to a scale optimized for best uniform distribution of the ESD current.

Secondly, because the ESD protection MOS transistor has shorter lateral source/drain diffusion region segmentation, the total number of source/drain contact openings can be increased, compared to the wide segmentation design of conventional ESD protection transistors. The direct result of this increased number of contact openings is the substantial reduction of discharge current density at each contact. This effectively enhances the ESD protection capability of the ESD protection MOS transistor circuit.

The following is an example of an ESD protection MOS transistor constructed in accordance with the invention laid out to a set of particular physical dimensions. These optimized dimensional figures are directed to the configuration depicted in the embodiment of FIG. 3. Specifically, in an ESD protection MOS transistor 300 having a channel length of about 0.5 μm and a channel width of about 60 μm, the following are optimized dimensions: The width W of each segmented diffusion region 32a–32h is about 2.4 μm; the width G of each finger-shaped extension 33a–33g is about 0.6 μm; the length L of each finger-shaped extension 33a–33g on the drain side is about 3.5 μm; the length P of each finger-shaped extension 33a–33g on the source side is about 0.5 μm; the distance D from the edge of each contact opening 37a–37g on the drain side to the edge of the gate 34 is about 5 μm; and, the distance S from the edge of each contact opening 39a–39h on the source side to the edge of the gate 34 is about 2 μm.

Figure 4:
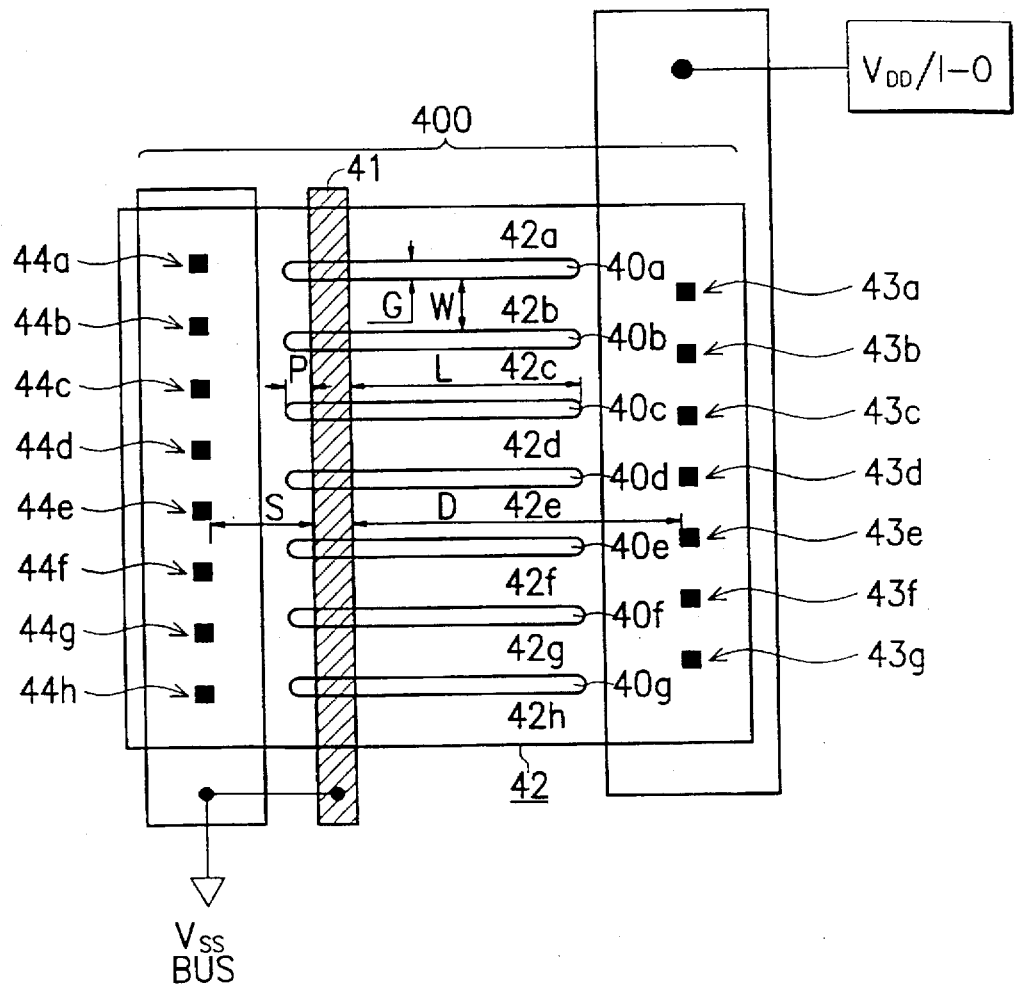
FIG. 4 schematically shows a top view of a layout of an ESD protection circuit in accordance with the second embodiment of the invention.

FIG. 4 schematically shows a top view of a layout of an ESD protection circuit in accordance with a second embodiment of the invention. When compared with the first embodiment shown in FIG. 3, the second embodiment differs in that no n-well is present, and the n$^+$ drain diffusion region on the drain side of the MOS transistor is single integrated region. Other than these, the basic layout is substantially the same. The following paragraphs describe this second embodiment only where relevant to point out differences from the first embodiment described above.

Essentially, a multiple number of field oxide islands 40a–40g arranged in a parallel array are formed. These field oxide islands 40a–40g extend from the transistor drain side into the source side, passing beneath the strip-shaped gate structure 41. This results in a layout configuration such as that schematically depicted in FIG. 4. Each of the field oxide islands 40a–40g has a basic rectangular configuration, although the corners may be somewhat rounded, as shown in FIG. 4. In this second embodiment of the invention, since there is no n-well present in the device substrate, one complete drain diffusion region 42 is therefore necessary. The single drain diffusion region 42 is required for the purpose of providing a multiple number of parallel-arranged drain diffusion paths 42a–42g. In this particular embodiment, resistance for each drain diffusion region path 42a–42g is based on the sheet resistance of the n$^+$ sheets in that segmented region 42a–42g.

The following is an example of an ESD protection MOS transistor constructed in accordance with the above-described second embodiment of the invention laid out to a set of particular physical dimensions. These optimized dimensional figures are directed to the configuration depicted in the embodiment of FIG. 4. Specifically, in an ESD protection MOS transistor 400 having a channel length of about 0.5 μm and a channel width of about 60 μm, the following are optimized dimensions: The width W of each segmented diffusion region 42a–42h is about 2.4 μm; the width G of each field oxide island 40a–40g is about 0.6 μm; the length L of each field oxide island 40a–40g on the drain side is about 3.5 μm; the length P of each field oxide island 40a–40g on the source side is about 0.5 μm; the distance D from the edge of each contact opening 43a–43g on the drain side to the edge of the gate 41 is about 5 μm; and, the distance S from the edge of each contact opening 44a–44h on the source side to the edge of the gate 41 is about 2 μm.

Figure 5:
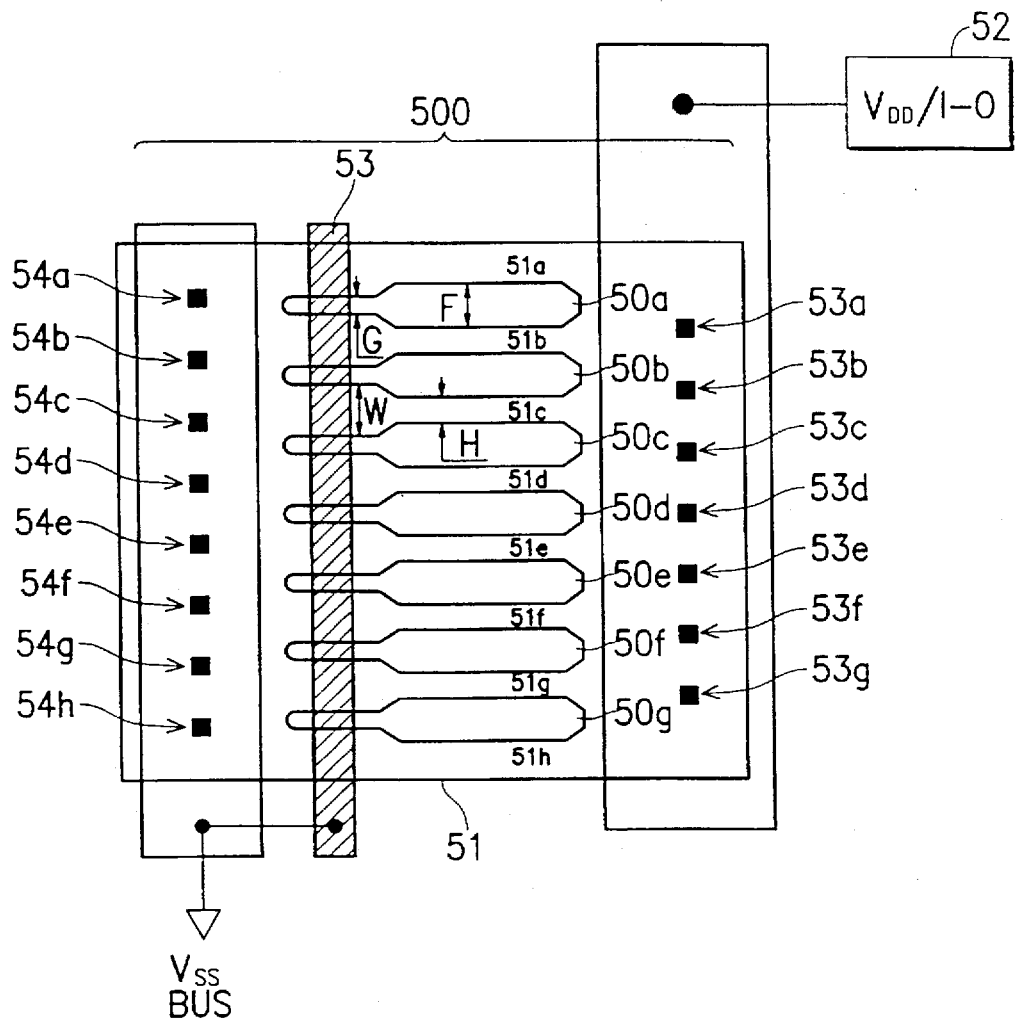
FIG. 5 schematically shows a top view of a layout of an ESD protection circuit in accordance with the third embodiment of the invention.

FIG. 5 schematically shows a top view of a layout of an ESD protection circuitry in accordance with a third embodiment of the invention. The transistor structural layout of the third embodiment is a variation of the second embodiment shown in FIG. 4. Specifically, when compared with the second embodiment, each of the segmented drain side n$^+$ diffusion regions 51a–51h is not shaped in a simple rectangular configuration, but rather varies in width along the longitudinal direction thereof. As shown in the drawing, each of the segmented drain side n$^+$ diffusion regions 51a–51h expands in width as it extends from the drain side to the source side of the MOS protection transistor 500. Other than this, the basic layout is substantially the same as the layout of an ESD protection circuitry shown in FIG. 4. The following paragraphs describe this third embodiment only where relevant to point out differences from the first and second embodiments described above.

The multiple parallel-aligned field oxide islands 50a–50g are shaped such that one end is wider than the other, somewhat like bowling pins. Thus, the segmented diffusion regions 51a–51h between each consecutive pair of field oxide islands has a cross section that widens from the drain side to the source side of the MOS transistor. Therefore, when an ESD event gives rise to a discharge current, the current originates at the IC device bonding pad 52, flows into the n$^+$ drain diffusion region 51 through the segmented passages 51a–51h in the diffusion region, and exits at the source diffusion region 54. During the passage through the segmented diffusion regions 51a–51h, the discharge current gradually disperses in the widening passages.

The following is an example of an ESD protection MOS transistor constructed in accordance with the above-described third embodiment of the invention laid out to a set of particular physical dimensions. These optimized dimensional figures are directed to the configuration depicted in the embodiment of FIG. 5. Specifically, in an ESD protection MOS transistor 500 having a channel length of about 0.5 μm and a channel width of about 60 μm, the following are optimized dimensions: In each gradually widening segmented diffusion region 51a–51h, the width W of the wide section is about 2.4 μm and the width H of the narrow section is about 1 μm; for each field oxide island 50a–50g, the width F of the wide section is about 2 μm and the width G of the narrow section is about 0.6 μm; the length of each field oxide island 50a–50g on the drain side is about 3.5 μm; the length of each field oxide island 50a–50g on the source side is about 0.5 μm; the distance from the edge of each contact opening 53a–53g on the drain side to the edge of the gate 53 is about 5 μm; and, the distance from the edge of each contact opening 54a–54h on the source side to the edge of the gate 53 is about 2 μm.

While the invention has been described by way of examples and in terms of preferred embodiments, it is to be understood that the invention is not limited thereto. To the contrary, it is intended to cover various modifications and similar arrangements. The scope of the appended claims, therefore, should be accorded the broadest possible interpretation so as to encompass all such modifications and similar arrangements.

What is claimed is:

1. A semiconductor field-effect transistor device for electrostatic discharge protection of a semiconductor integrated circuit device, said transistor having a segmented diffusion region and comprising:

a substrate;

a gate having an extended strip-shaped structure, formed on said substrate;

a well region formed in said substrate on a first side of said gate;

a first drain diffusion region formed in said well region;

a source diffusion region formed in said substrate, on a second side of said gate opposite the first side of said gate;

a second drain diffusion region formed partially inside said well region on the first side of said gate and substantially between the source diffusion region and the first drain diffusion region; and a field oxide layer formed over a surface of said substrate, said field oxide layer comprising a plurality of finger-shaped extensions originating from said first side of said gate and extending to said second side of said gate, wherein said plurality of finger-shaped extensions divide said second drain diffusion region into a plurality of parallel-aligned segmented diffusion regions but do not fully divide said source diffusion region.

2. The transistor device of claim 1, wherein said transistor device is an N-type metal-oxide semiconductor field-effect transistor device.

3. The transistor device of claim 2, wherein said well region is an N-well region.

4. The transistor device of claim 3, wherein said first and second drain diffusion regions and said source diffusion region are N-type diffusion regions.

5. The transistor device of claim 1, wherein the source diffusion region is electrically connected to a $V_{ss}$ ground potential plane of the semiconductor integrated circuit device via an array of contacts, and wherein the end of each of the plurality of finger-shaped extensions on the second side of the gate is separated from the edge of the array of contacts for a predetermined distance.

6. The transistor device of claim 5, wherein at least one of the contacts is partially at the extending direction of the plurality of finger-shaped extensions on the second side of the gate.

7. A semiconductor field-effect transistor device for electrostatic discharge protection of a semiconductor integrated circuit device, said transistor having a segmented diffusion region and comprising:

a substrate;

a gate having an extended strip-shaped structure formed on said substrate;

a drain diffusion region formed in said substrate on a first side of said gate;

a source diffusion region formed in said substrate on a second side of said gate;

a plurality of parallel-aligned field oxide islands formed over a surface of the substrate, said plurality of field oxide islands originating from the first side of said gate, and extending to the second side of said gate and passing underneath said gate, wherein said plurality of field oxide islands divide part of said drain diffusion region into an array of parallel diffusion paths and do not fully divide said source diffusion region.

8. The transistor device of claim 7, wherein said transistor device is an N-type metal-oxide semiconductor field-effect transistor.

9. The transistor device of claim 8, wherein each of said plurality of field oxide islands has a rectangular configuration.

10. The transistor device of claim 8, wherein the shape of each of said plurality of field oxide islands is like bowling pin.

11. The transistor device of claim 7, wherein the source diffusion region is electrically connected to a $V_{ss}$ ground potential plane of the semiconductor integrated circuit device via an array of contacts, and wherein the end of each of the plurality of field oxide islands on the second side of the gate is separated from the edge of the array of contacts for a predetermined distance.

12. The transistor device of claim 11, wherein at least one of the contacts is partially at the extending direction of the plurality of field oxide islands on the second side of the gate.

* * * * *